United States Patent
Tarui et al.

(10) Patent No.: US 11,152,310 B2
(45) Date of Patent: Oct. 19, 2021

(54) MICROWAVE DEVICE AND ANTENNA FOR IMPROVING HEAT DISSIPATION

(71) Applicant: Mitsubishi Electric Corporation, Chiyoda-ku (JP)

(72) Inventors: Yukinobu Tarui, Tokyo (JP); Makoto Kimura, Tokyo (JP); Katsumi Miyawaki, Tokyo (JP); Kiyoshi Ishida, Tokyo (JP); Hiroaki Matsuoka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 118 days.

(21) Appl. No.: 16/491,767

(22) PCT Filed: Feb. 22, 2018

(86) PCT No.: PCT/JP2018/006578
§ 371 (c)(1),
(2) Date: Sep. 6, 2019

(87) PCT Pub. No.: WO2018/168391
PCT Pub. Date: Sep. 20, 2018

(65) Prior Publication Data
US 2021/0134733 A1 May 6, 2021

(30) Foreign Application Priority Data
Mar. 13, 2017 (JP) .............................. JP2017-047452

(51) Int. Cl.
*H01L 23/552* (2006.01)
*H01L 23/66* (2006.01)
(Continued)

(52) U.S. Cl.
CPC ............ *H01L 23/552* (2013.01); *H01L 23/36* (2013.01); *H01L 23/5383* (2013.01); *H01L 23/66* (2013.01); *H01L 2223/66* (2013.01)

(58) Field of Classification Search
CPC ...... H01L 23/66; H01L 23/5383; H01L 23/36; H01L 23/528; H01L 23/552;
(Continued)

(56) References Cited

U.S. PATENT DOCUMENTS 9,496,207 B1 * 11/2016 Le ....................... H01L 29/7816
10,085,352 B2 * 9/2018 Costa .................. H01L 25/0655
(Continued)

FOREIGN PATENT DOCUMENTS

JP       2002-138205 A    5/2002
JP       2008-515189 A    5/2008
(Continued)

OTHER PUBLICATIONS

Japanese Office Action dated Jul. 14, 2020 in Patent Application No. 2019-505820 (with English translation), 7 pages.
(Continued)

*Primary Examiner* — Alexander O Williams
(74) *Attorney, Agent, or Firm* — Oblon, McClelland, Maier & Neustadt, L.L.P.

(57) ABSTRACT

A microwave device includes: a multilayer resin substrate being a first multilayer resin substrate; an IC being a radio frequency circuit provided on the multilayer resin substrate and electrically connected to the multilayer resin substrate; a heat spreader provided on a side opposite to the multilayer resin substrate across the IC, and in contact with the IC; a mold resin covering the periphery of the IC and the heat spreader; and a conductive film covering the mold resin and the heat spreader, where an inner side of the conductive film is in contact with the heat spreader, and the conductive film is electrically connected to a ground via hole of the multilayer resin substrate.

9 Claims, 5 Drawing Sheets

(51) Int. Cl.
*H01L 23/538* (2006.01)
*H01L 23/36* (2006.01)

(58) Field of Classification Search
CPC ............... H01L 2223/66; H01L 23/538; H01L 23/5384; H01L 23/3121; H01L 23/4334; H01L 2224/16145; H01L 2224/0557; H01L 2924/15192; H01L 2224/73253; H01L 2924/15313; H01L 2924/19105; H01L 2924/3025; H01L 2224/16227; H01L 2223/6677; H01L 2224/0401; H01Q 21/065; H01Q 1/2283
USPC ......................................................... 257/728
See application file for complete search history.

(56) References Cited

U.S. PATENT DOCUMENTS

| | | | | |
|---|---|---|---|---|
| 10,404,226 B2* | 9/2019 | Kitahara | ................. | H01L 25/18 |
| 10,950,599 B1* | 3/2021 | Or-Bach | ............. | H01L 27/0688 |
| 2009/0184403 A1* | 7/2009 | Wang | ..................... | H01L 24/48 |
| | | | | 257/659 |
| 2013/0256864 A1 | 10/2013 | Nagano et al. | | |
| 2017/0133309 A1* | 5/2017 | Kim | ......................... | H01L 24/19 |
| 2017/0317002 A1 | 11/2017 | Kitahara et al. | | |
| 2018/0061794 A1* | 3/2018 | Kim | ........................ | H01L 24/82 |
| 2018/0166387 A1* | 6/2018 | Matsui | .................... | H01L 23/12 |
| 2019/0173195 A1* | 6/2019 | Kim | ......................... | H01Q 3/24 |
| 2019/0273069 A1* | 9/2019 | Or-Bach | ............. | H01L 25/0657 |
| 2020/0059204 A1* | 2/2020 | Kahloon | ............. | H01L 21/4853 |
| 2020/0321293 A1* | 10/2020 | Kim | ..................... | H01Q 1/2283 |
| 2021/0043544 A1* | 2/2021 | Eid | ..................... | H01L 23/3157 |

FOREIGN PATENT DOCUMENTS

JP      2013-207132 A      10/2013
WO   WO 2016/117196 A1   7/2016

OTHER PUBLICATIONS

International Search Report dated May 15, 2018 in PCT/JP2018/006578 filed Feb. 22, 2018.

Office Action dated Jul. 27, 2021 in corresponding Great Britain Application No. GB1912749.7.

* cited by examiner

MICROWAVE DEVICE AND ANTENNA FOR IMPROVING HEAT DISSIPATION

CROSS-REFERENCE TO RELATED APPLICATIONS

The present application is a 35 U.S.C. § 371 national stage application of International patent application PCT/JP2018/006578, filed Feb. 22, 2018, which is based on and claims the benefit of priority to Japanese Application No. 2017-047452, filed on Mar. 13, 2017. The entire contents of these applications are incorporated herein by reference.

FIELD

The present invention relates to a microwave device having a heat spreader and an antenna.

BACKGROUND

A semiconductor package which is a microwave device disclosed in Patent Literature 1 includes a semiconductor chip having a front electrode and a back electrode, a front cap portion having a front penetrating electrode and located on the front surface side of the semiconductor chip, a back cap portion having a back penetrating electrode and located on the back surface side of the semiconductor chip, a front connecting portion electrically connecting the front electrode and the front penetrating electrode, and a back connecting portion electrically connecting the back electrode and the back penetrating electrode.

The semiconductor chip is sealed in a space formed between the front cap portion and the back cap portion when the back cap portion is connected to the front cap portion. The back electrode of the sealed semiconductor chip is connected to one end of the back connecting portion, and another end of the back connecting portion is connected to the front penetrating electrode of the front cap portion. Moreover, a gap is formed between the back electrode of the sealed semiconductor chip and the back cap portion. This gap is a region excluding the part where the back electrode, the back connecting portion, and the front penetrating electrode are connected, in the space formed between the back electrode of the semiconductor chip and the back cap portion.

In the semiconductor package disclosed in Patent Literature 1, a high resistance material with a resistivity of 100 [Ω·cm] or higher is used as the material of the back cap portion, and the back penetrating electrode provided in the back cap portion having high resistivity and the back electrode provided on the semiconductor chip are electrically and thermally connected, to secure the ground potential of the semiconductor chip and improve heat dissipation of the semiconductor chip.

CITATION LIST

Patent Literature

Patent Literature 1: Japanese Patent Application Laid-open No. 2013-207132

SUMMARY

Technical Problem

However, in the semiconductor package as disclosed in Patent Literature 1, the cross-sectional area of the back penetrating electrode provided in the back cap portion is smaller than the surface area of the back electrode provided on the semiconductor chip due to constraints of formation in a semiconductor process. As a result, the thermal resistance between the semiconductor chip and the back cap portion increases so that the heat generated in the semiconductor chip is less easily transmitted to the back cap portion and that heat dissipation performance of the semiconductor chip cannot be further improved.

The present invention has been made in view of the above, and an object of the present invention is to provide a microwave device that can improve heat dissipation performance.

Solution to Problem

A microwave device according to an aspect of the present invention includes: a first multilayer resin substrate; a radio frequency circuit provided on the first multilayer resin substrate and electrically connected to the first multilayer resin substrate; a heat spreader provided on a side opposite to the first multilayer resin substrate across the radio frequency circuit, and in contact with the radio frequency circuit; a resin covering the periphery of the radio frequency circuit and the heat spreader; and a conductive film covering the resin and the heat spreader, wherein an inner side of the conductive film is in contact with the heat spreader, and the conductive film is electrically connected to a ground via hole of the first multilayer resin substrate.

Advantageous Effects of Invention

The present invention has an effect of being able to improve the heat dissipation performance.

DESCRIPTION OF EMBODIMENT

Hereinafter, a microwave device and an antenna according to an embodiment of the present invention will be described in detail with reference to the drawings. Note that the present invention is not limited to the embodiment.

Embodiment

Figure 1:
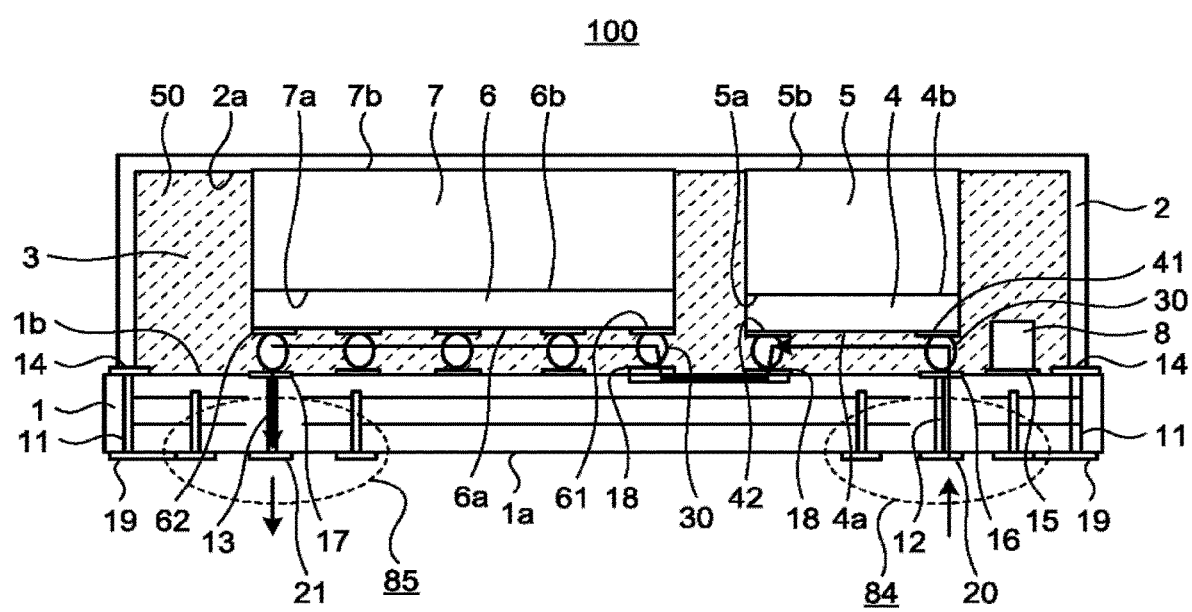
FIG. 1 is a cross-sectional view of a microwave device according to an embodiment of the present invention.
Figure 1:
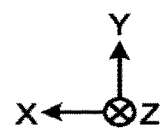
Figure 2:
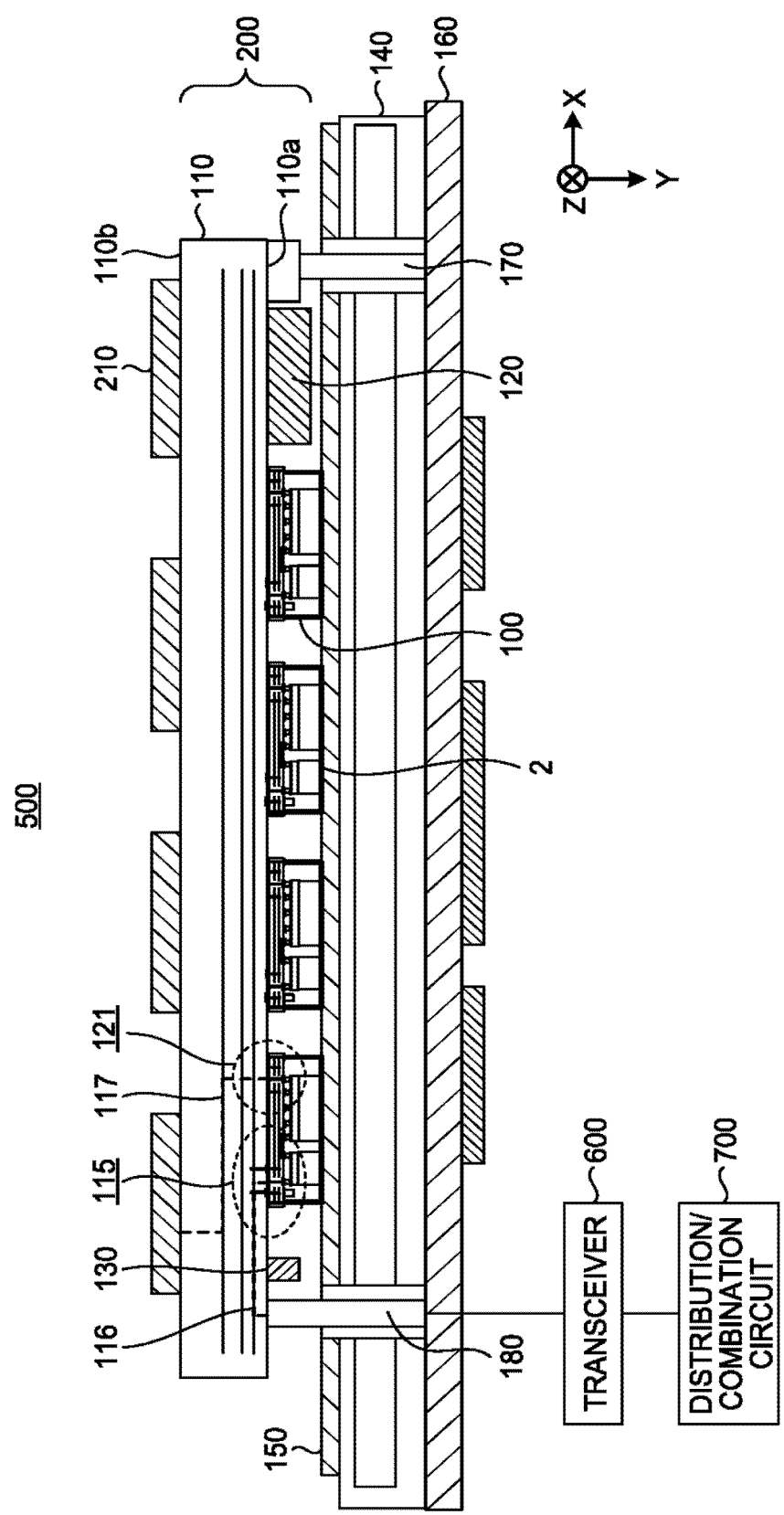
FIG. 2 is a cross-sectional view of an antenna including the microwave device illustrated in FIG. 1.
Figure 3:
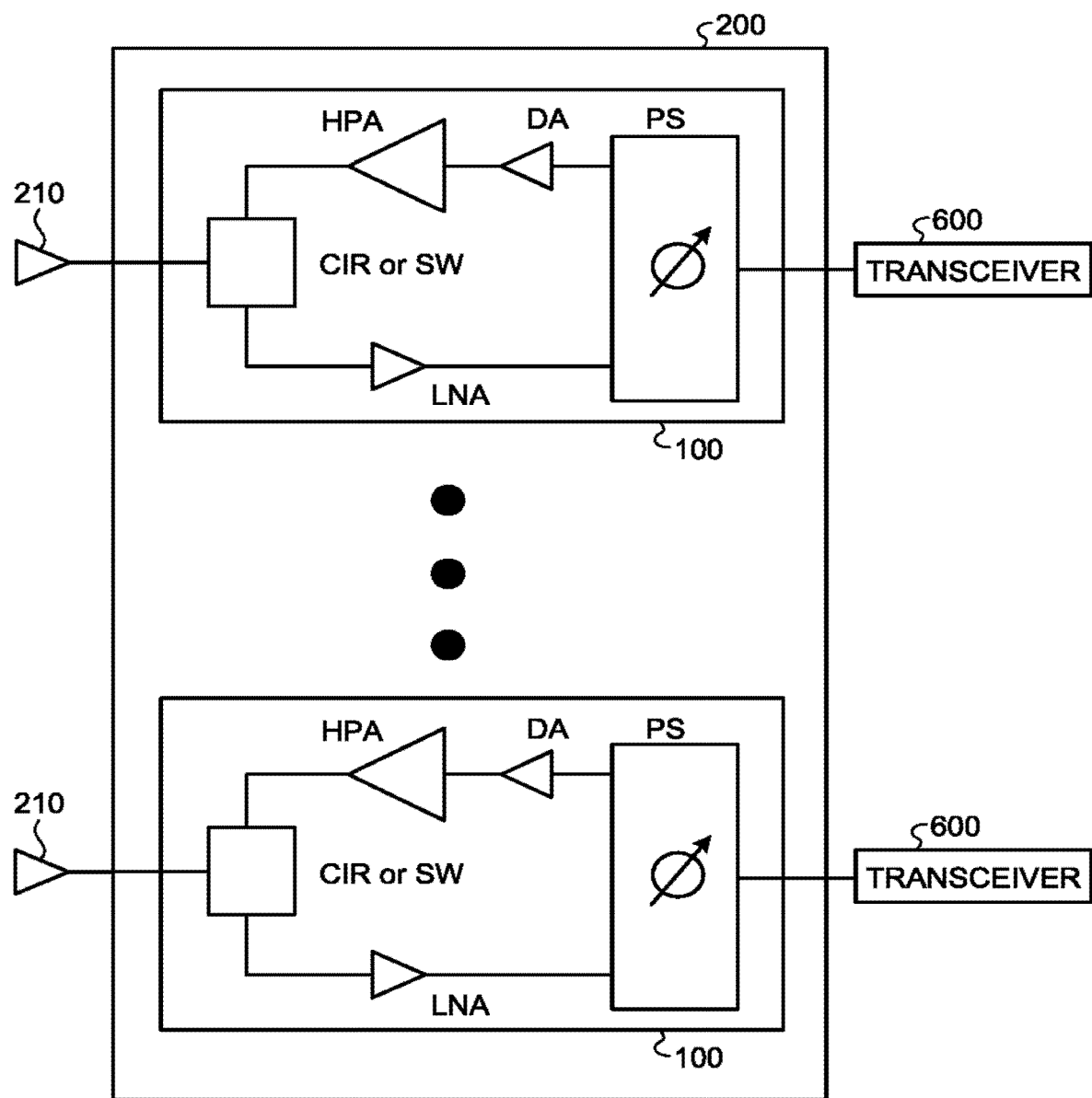
FIG. 3 is a diagram illustrating a functional block of the microwave device illustrated in FIG. 1.

FIG. 1 is a cross-sectional view of a microwave device according to an embodiment of the present invention. FIG. 2 is a cross-sectional view of an antenna including the microwave device illustrated in FIG. 1. FIG. 3 is a diagram illustrating a functional block of the microwave device illustrated in FIG. 1.

As illustrated in FIG. 1, a microwave device 100 includes a multilayer resin substrate 1 which is a first multilayer resin substrate for a device, an integrated circuit (IC) 4 which is a high heat generating radio frequency (RF) device, and a conductive heat spreader 5 thermally connected to the IC 4.

The microwave device 100 further includes an IC 6 which is a high heat generating RF device, a conductive heat spreader 7 thermally connected to the IC 6, and a chip component 8 surface-mounted on the multilayer resin substrate 1.

The IC 4 and the IC 6 are each an example of a radio frequency circuit, where the IC 4 is a driver amplifier (DA) in the present embodiment. The IC 6 is a high power amplifier (HPA). The chip component 8 is a bypass capacitor that suppresses an RF superimposed wave.

The multilayer resin substrate 1 has a first plate surface 1a which is an end surface on the side of one end of the multilayer resin substrate 1 in a Y axis direction, and a second plate surface 1b which is an end surface on the side of the opposite end of the multilayer resin substrate 1 in the Y axis direction. FIG. 1 uses the right-handed XYZ coordinates, where the direction in which the ICs 4 and 6 are arranged corresponds to an X axis direction, the direction in which the first plate surface 1a and the second plate surface 1b of the multilayer resin substrate 1 are arranged corresponds to the Y axis direction, and the direction orthogonal to both the X axis direction and the Y axis direction corresponds to a Z axis direction.

The multilayer resin substrate 1 includes a plurality of ground via holes 11 formed near the outer periphery of the multilayer resin substrate 1, a signal via hole 12, and a signal via hole 13. The multilayer resin substrate 1 on the side of the second plate surface 1b is provided with a ground pattern 14 electrically connected to one end in the Y axis direction of each of the plurality of ground via holes 11, a signal line 15 electrically connected to the chip component 8, a pad 16 electrically connected to one end in the Y axis direction of the signal via hole 12, a pad 17 electrically connected to one end in the Y axis direction of the signal via hole 13, and a plurality of pads 18.

The multilayer resin substrate 1 on the side of the first plate surface 1a is provided with a ground pattern 19 electrically connected to the opposite end in the Y axis direction of each of the ground via holes 11, a signal input/output terminal 20 electrically connected to the opposite end in the Y axis direction of the signal via hole 12, and a signal input/output terminal 21 electrically connected to the opposite end in the Y axis direction of the signal via hole 13.

The plurality of ground via holes 11 is formed near the outer peripheral surface of the multilayer resin substrate 1 to surround the signal line 15, the pads 16, 17, and 18, signal pads such as the signal input/output terminals 20 and 21, and the signal via holes 12 and 13.

Types of the signal line 15 include an input RF line, a gate bias supply line, an output RF line, and a drain bias supply line.

Two input/output terminals 41 and 42 are provided on the side of one end surface 4a of the IC 4 in the Y axis direction. The input/output terminal 41 is electrically connected to the pad 16 via a fine bonding material 30. The input/output terminal 42 is electrically connected to the pad 18 via the fine bonding material 30. The fine bonding material 30 can be exemplified by a conductive copper pillar or solder ball. The heat spreader 5 is provided on the side of the opposite end surface 4b of the IC 4 in the Y axis direction. The IC 4 is thermally connected to one end surface 5a of the heat spreader 5 in the Y axis direction.

Two input/output terminals 61 and 62 are provided on the side of one end surface 6a of the IC 6 in the Y axis direction. The input/output terminal 61 is electrically connected to the pad 18 via the fine bonding material 30. The input/output terminal 62 is electrically connected to the pad 17 via the fine bonding material 30. The heat spreader 7 is provided on the side of the opposite end surface 6b of the IC 6 in the Y axis direction. The IC 6 is thermally connected to one end surface 7a of the heat spreader 7 in the Y axis direction.

The ICs 4 and 6 provided to be in contact with the heat spreaders 5 and 7 are joined to the multilayer resin substrate 1, and a mold resin 50 is formed on the multilayer resin substrate 1 to which the ICs 4 and 6 are joined. The mold resin 50 is molded so as to contain the ICs 4 and 6, the heat spreaders 5 and 7, the chip component 8, the signal line 15, and the pads 16, 17, and 18.

The outer peripheral surface of the IC 4 is covered with the mold resin 50 except for the opposite end surface 4b of the IC 4 in the Y axis direction. The outer peripheral surface of the IC 6 is covered with the mold resin 50 except for the opposite end surface 6b of the IC 6 in the Y axis direction. The outer peripheral surface of the heat spreader 5 is covered with the mold resin 50 except for the one end surface 5a of the heat spreader 5 in the Y axis direction and the opposite end surface 5b of the heat spreader 5 in the Y axis direction.

The outer peripheral surface of the heat spreader 7 is covered with the mold resin 50 except for the one end surface 7a of the heat spreader 7 in the Y axis direction and the opposite end surface 7b of the heat spreader 7 in the Y axis direction. The opposite end surface 5b of the heat spreader 5 in the Y axis direction is exposed without being covered with the mold resin 50. The opposite end surface 7b of the heat spreader 7 in the Y axis direction is exposed without being covered with the mold resin 50.

A method of molding the mold resin 50 may be one that molds a resin material around the ICs 4 and 6 and the heat spreaders 5 and 7 such that an end surface on the side of an inner surface 2a of a conductive film 2 in the Y axis direction has no difference in level. Alternatively, the opposite end surfaces 5b and 7b of the heat spreaders 5 and 7 may be exposed by grinding the resin material, which has been molded around the ICs 4 and 6 and the heat spreaders 5 and 7, such that the end surface of the mold resin 50 on the side of the inner surface 2a is substantially in the same plane with upper end surfaces of the heat spreaders 5 and 7 or such that the end surface of the mold resin 50 on the side of the inner surface 2a and the upper end surfaces of the heat spreaders 5 and 7 are made even.

The conductive film 2 is formed on the surfaces of the mold resin 50 and the heat spreaders 5 and 7. The conductive film 2 is a conductive coating such as electroless plating or a conductive adhesive, where nickel (Ni) or silver can be exemplified as the material of the plating film, and an epoxy material containing silver particles can be exemplified as the conductive adhesive. Note that when the electroless plating is used as the conductive film 2, a conductive adhesive or a thin conductive metal sheet may be brought into contact with an upper surface of a boundary region where the end surface of the mold resin 50 on the side of the inner surface 2a adjoins the upper end surfaces of the heat spreaders 5 and 7 to enhance electrical connection and electromagnetic shield function of the boundary region between the end surface of the mold resin 50 on the side of the inner surface 2a and the upper end surfaces of the heat spreaders 5 and 7. A region indicated by reference numeral 3 is a space formed between the multilayer resin substrate 1 and the conductive film 2 and filled with the mold resin 50.

The inner surface 2a of the conductive film 2 provided on the multilayer resin substrate 1 is thermally connected to the opposite end surface 5b in the Y axis direction of the heat spreader 5 and thermally connected to the opposite end surface 7*b* in the Y axis direction of the heat spreader 7. Moreover, an end in the Y axis direction of the conductive film 2 provided on the multilayer resin substrate 1 is electrically connected to the ground pattern 14.

In the microwave device 100 configured as described above, an RF signal is input to the signal input/output terminal 20. The RF signal being a transmit signal input to the signal input/output terminal 20 is input to the IC 4 via the signal via hole 12, the pad 16, the fine bonding material 30, and the input/output terminal 41. The RF signal input to the IC 4 is transmitted to the IC 6 via the input/output terminal 42, the fine bonding material 30, and the pad 18. The RF signal input to the IC 6 via the input/output terminal 61 is transmitted to the signal input/output terminal 21 via the input/output terminal 62, the fine bonding material 30, the pad 17, and the signal via hole 13.

The pad 16, the signal via hole 12, and the signal input/output terminal 20 form a signal terminal unit 84 having a coaxial structure. The pad 17, the signal via hole 13, and the signal input/output terminal 21 form a signal terminal unit 85 having a coaxial structure.

As illustrated in FIG. 2, an antenna 500 includes a microwave module 200, a heat dissipation sheet 150 having elasticity, a heat sink 140, and a control board 160. A modulus of elasticity of the heat dissipation sheet 150 is smaller than a modulus of elasticity of the conductive film 2 of the microwave device 100. The microwave module 200, the heat dissipation sheet 150, the heat sink 140, and the control board 160 are arranged in the Y axis direction in the order of the microwave module 200, the heat dissipation sheet 150, the heat sink 140, and the control board 160.

The microwave module 200 includes a multilayer resin substrate 110 for a module which is a second multilayer resin substrate, a plurality of the microwave devices 100, a control IC 120, a chip component 130, and a plurality of antenna elements 210.

The plurality of the microwave devices 100, the control IC 120, and the chip component 130 are provided on one end surface 110*a* in the Y axis direction of the multilayer resin substrate 110. The control IC 120 and the chip component 130 are surface-mounted on the multilayer resin substrate 110. The chip component 130 can be exemplified by a resistor or a capacitor. The plurality of antenna elements 210 is provided on the opposite end surface 110*b* in the Y axis direction of the multilayer resin substrate 110.

The heat dissipation sheet 150 is in contact with the heat sink 140 at one end surface in the Y axis direction, and is in contact with the conductive film 2 of each of the plurality of the microwave devices 100 at the opposite end surface in the Y axis direction. The heat dissipation sheet 150 is a sheet having high elasticity and high heat conductivity. The material of the heat dissipation sheet 150 can be exemplified by silicone rubber filled with high heat conductive material such as carbon or silver.

The multilayer resin substrate 110 and the control board 160 are connected to each other by a power/control connector 170 which is a first connector and an RF connector 180 which is a second connector via the heat dissipation sheet 150 and the heat sink 140.

The multilayer resin substrate 110 is fixed to the heat sink 140 with a screw or the like while being pressurized in the Y axis direction, so that the conductive films 2 of the microwave devices 100 are pressed against the heat dissipation sheet 150 having elasticity. As a result, the conductive films 2 of the microwave devices 100, the heat dissipation sheet 150, and the heat sink 140 are thermally connected.

The multilayer resin substrate 110 is provided with signal terminal units 115 and 121 each having a coaxial structure, an RF transmission line 116 which is an inner layer signal line, and an RF transmission line 117 which is an inner layer signal line. The RF connector 180 and the microwave devices 100 are connected to each other via the RF transmission line 116 and the signal terminal unit 115. The antenna elements 210 and the microwave devices 100 are connected to each other via the RF transmission line 117 and the signal input/output terminal 21.

In the control board 160, power and a control signal to be supplied to the microwave module 200 are generated, and the power and the control signal are input to the microwave devices 100 on the multilayer resin substrate 110 via the power/control connector 170.

A transmission input signal and a reception output signal being RF signals of the microwave module 200 are transmitted between the antenna elements 210 and a transceiver 600 or between the antenna elements 210 and a distribution/combination circuit 700 via the RF connector 180. The order of connection of the transceiver 600 and the distribution/combination circuit 700 is arbitrary.

An RF transmit signal output from the transceiver 600 is transmitted to the signal input/output terminal 20 illustrated in FIG. 1 via the RF connector 180, the RF transmission line 116, and the signal terminal unit 115. The RF transmit signal output from the signal input/output terminal 21 illustrated in FIG. 1 is transmitted to the antenna elements 210 via the RF transmission line 117 and output from the antenna elements 210.

An RF received signal received by the antenna elements 210 is transmitted to the signal input/output terminal 21 illustrated in FIG. 1 via the RF transmission line 117 and further transmitted to the transceiver 600 via the signal input/output terminal 20 illustrated in FIG. 1 and the RF connector 180.

As illustrated in FIG. 3, the microwave module 200 includes the plurality of microwave devices 100. The microwave devices 100 each include a low noise amplifier (LNA), a circulator (CIR), a phase shifter (PS), and the like in addition to the HPA and DA described above. The RF transmit signal output from the transceiver 600 is transmitted to the antenna element 210 via the PS, DA, HPA, and CIR. The RF received signal received by the antenna element 210 is transmitted to the transceiver 600 via the CIR, LNA, and PS. Here, instead of the CIR, a switch may be used for a transmission-reception switching circuit on the side of the antenna. In FIG. 3, the switch is denoted as "SW".

Figure 4:
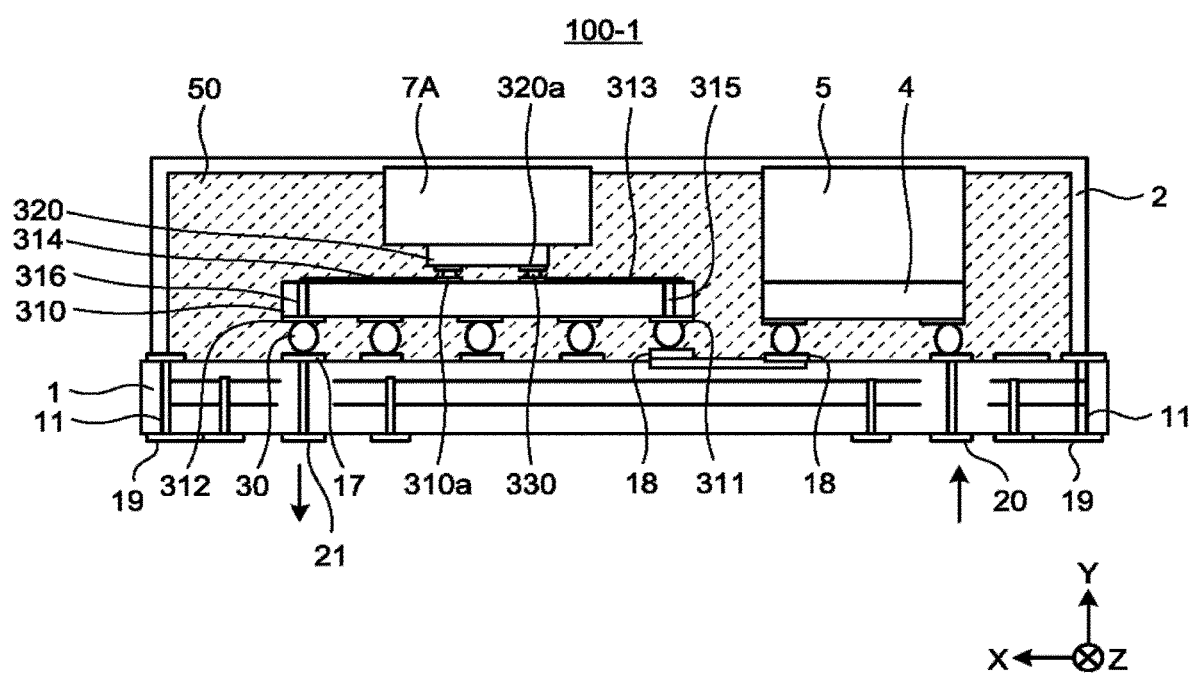
FIG. 4 is a view illustrating a variation of the microwave device illustrated in FIG. 1.
Figure 5:
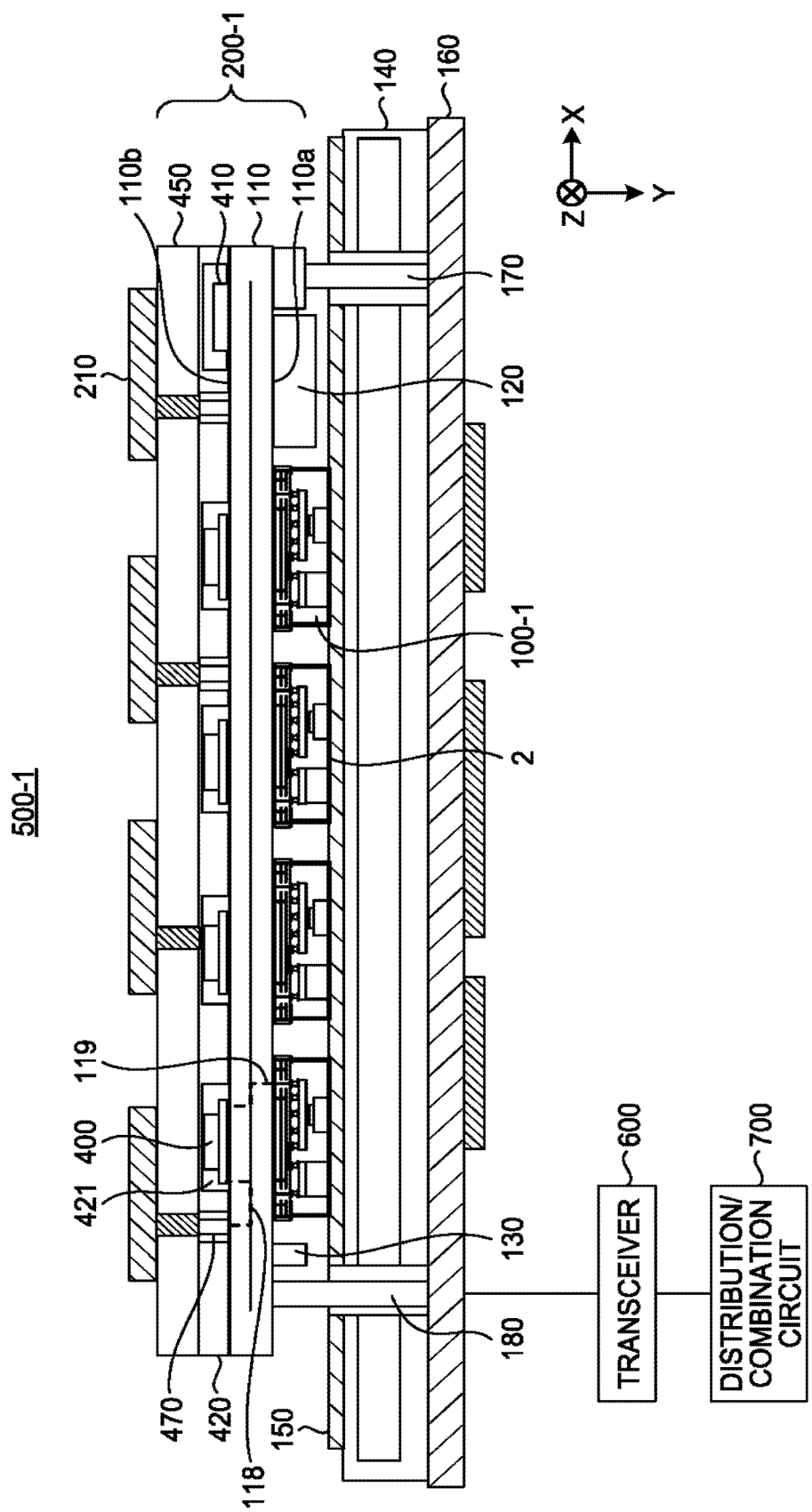
FIG. 5 is a view illustrating a variation of the antenna illustrated in FIG. 2.

FIG. 4 is a view illustrating a variation of the microwave device illustrated in FIG. 1. FIG. 5 is a view illustrating a variation of the antenna illustrated in FIG. 2.

The difference between a microwave device 100-1 illustrated in FIG. 4 and the microwave device 100 illustrated in FIG. 1 is that the microwave device 100-1 includes, instead of the IC 6 and the heat spreader 7, a heat spreader 7A, a low-cost semiconductor substrate 310 which is a first semiconductor substrate not including a transistor, and a high-cost semiconductor substrate 320 which is a second semiconductor substrate including a transistor. The high-cost semiconductor substrate 320 is provided with the transistor and is made of gallium nitride material, for example, whereas the low-cost semiconductor substrate 310 is provided with a matching circuit and is made of gallium arsenide material, for example. The transistor provided on the high-cost semiconductor substrate 320 is a field-effect transistor or a bipolar transistor of high power durability and high voltage, and amplifies and outputs a high power microwave signal to thus generate a large amount of heat.

Although a transistor may be mounted on the low-cost semiconductor substrate 310, the transistor with a voltage lower than that for the transistor on the high-cost semiconductor substrate 320 is used so that the amount of heat generated is lower than that of the high-cost semiconductor substrate 320.

As illustrated in FIG. 4, a signal pad 310a of the low-cost semiconductor substrate 310 and a signal pad 320a of the high-cost semiconductor substrate 320 are disposed to face each other and are flip chip bonded by a fine bonding material 330. Thus, a surface pattern 313 and a surface pattern 314 on the low-cost semiconductor substrate 310 are electrically connected to the signal pad 320a via the signal pad 310a and the fine bonding material 330.

The high-cost semiconductor substrate 320 is thermally connected to the heat spreader 7A. The heat spreader 7A is thermally connected to the conductive film 2 as is the case with the heat spreader 7 illustrated in FIG. 1.

An input/output terminal 311 provided on the low-cost semiconductor substrate 310 is electrically connected to the surface pattern 313 via a through hole 315 formed in the low-cost semiconductor substrate 310. The input/output terminal 311 is also electrically connected to the pad 18 on the multilayer resin substrate 1 via the fine bonding material 30.

An input/output terminal 312 provided on the low-cost semiconductor substrate 310 is electrically connected to the surface pattern 314 via a through hole 316 formed in the low-cost semiconductor substrate 310. The input/output terminal 312 is also electrically connected to the pad 17 on the multilayer resin substrate 1 via the fine bonding material 30.

The difference between an antenna 500-1 illustrated in FIG. 5 and the antenna 500 illustrated in FIG. 2 is that the antenna 500-1 includes a microwave module 200-1 instead of the microwave module 200.

The microwave module 200-1 includes an antenna substrate 450, a conductive chassis 420, and the multilayer resin substrate 110. A groove 421 serving as a component mounting portion is formed in the conductive chassis 420. The groove portion 421 is formed by cutting out the conductive chassis 420, diffusion bonding, three-dimensional fabrication by sintering metal powder, or the like. The antenna substrate 450, the conductive chassis 420, and the multilayer resin substrate 110 are arranged in the Y axis direction in the order of the antenna substrate 450, the conductive chassis 420, and the multilayer resin substrate 110.

The plurality of the microwave devices 100-1, the control IC 120, and the chip component 130 are provided on the one end surface 110a of the multilayer resin substrate 110 in the Y axis direction. A plurality of circulators 400 and a control IC 410 are surface-mounted on the opposite end surface 110b of the multilayer resin substrate 110 in the Y axis direction. The circulators 400 are each housed in the groove 421 of the conductive chassis 420 and electrically connect the ground plane on the opposite end surface 110b of the multilayer resin substrate 110 and the conductive chassis 420 to form a shield structure.

The conductive chassis 420 is provided with an RF connector 470, and the antenna element 210 provided on the antenna substrate 450 is electrically connected to the RF connector 470.

The multilayer resin substrate 110 is provided with an RF transmission line 118 which is an inner layer signal line and an RF transmission line 119 which is an inner layer signal line. The circulator 400 is connected to the RF connector 470 via the RF transmission line 118. The circulator 400 is also connected to the microwave device 100-1 via the RF transmission line 119.

As described above, in the antennas 500 and 500-1 illustrated in FIGS. 2 and 5, the heat sink 140, the microwave modules 200 and 200-1, and the antenna elements 210 are arranged in layers so that the thickness in the Y axis direction of each of the antennas 500 and 500-1 can be reduced and that a small and lightweight antenna can be realized.

In the microwave device 100 according to the embodiment, the ICs 4 and 6, the heat spreaders 5 and 7, the conductive film 2, and the heat sink 140 are thermally connected, the cross-sectional area of the heat spreader 5 in the X axis direction is larger than or equal to the cross-sectional area of the IC 4 in the X axis direction, and the cross-sectional area of the heat spreader 7 in the X axis direction is larger than or equal to the cross-sectional area of the IC 6 in the X axis direction. In the semiconductor package disclosed in Patent Literature 1, the cross-sectional area of the back penetrating electrode provided in the back cap portion is smaller than the surface area of the back electrode provided on the semiconductor chip, whereby the heat generated in the semiconductor chip cannot be effectively radiated to the outside of the semiconductor package. On the other hand, the microwave device 100 according to the embodiment uses the heat spreaders 5 and 7 having wide cross-sectional areas to reduce the thermal resistance between the ICs 4 and 6 and the heat sink 140, thereby being able to effectively transfer the heat generated in the ICs 4 and 6 to the heat sink 140 without the RF signals, power, and control signals transmitted between the multilayer resin substrate 1 and the ICs 4 and 6 interfering with each other.

Moreover, in the microwave device 100, even in a case where the height in the Y axis direction of the conductive film 2 varies among the plurality of microwave devices 100 due to variations in the height of the microwave devices 100, the warpage of the multilayer resin substrate 110, variations in the height of the bonding layer between the microwave devices 100 and the multilayer resin substrate 110, or the like, the heat dissipation sheet 150 having elasticity can ensure thermal connection between the conductive film 2 and the heat dissipation sheet 150.

The mold resin 50 is molded using a conventionally adopted method, whereby the microwave device 100 can be manufactured at low cost. Moreover, in the embodiment, the periphery of the ICs 4 and 6 and the heat spreaders 5 and 7 is hardened with the resin material so that, even in a case where the microwave device 100 is fixed to be pressed against the heat dissipation sheet 150, the pressure applied to the ICs 4 and 6 via the conductive film 2 is also dispersed to the mold resin 50, and thus mechanical stress applied to the terminals provided in the ICs 4 and 6 is reduced. Therefore, even in the case where the microwave device 100 is fixed to be pressed against the heat dissipation sheet 150 in order to reduce the thermal resistance between the ICs 4 and 6 and the heat dissipation sheet 150, reduction in the strength of mechanical connection between the multilayer resin substrate 1 and the ICs 4 and 6 is prevented so that reduction in life of the microwave device 100 is prevented.

Furthermore, in the microwave device 100 according to the embodiment, the periphery of the mold resin 50 and the heat spreaders 5 and 7 is covered with the conductive film 2, the ground via hole 11 of the multilayer resin substrate 1 is electrically connected to the conductive film 2, and the signal terminal units 84 and 85 having the coaxial structure are connected to the signal terminal units 115 and 121 having the coaxial structure formed in the multilayer resin substrate 110, respectively. As a result, the electromagnetic waves emitted from the ICs 4 and 6 are confined inside the microwave device 100. Therefore, the entire microwave module 200 does not need to be covered with a shield, and the structure can be simplified.

In the case where the plurality of ICs 4 and 6 is housed in the microwave device 100 as in the embodiment, the size of the microwave device 100 is about 10 [mm] per side. Here, in a case where the heat spreaders 5 and 7 are not provided in the package covered with the conductive material, the resonant frequency is reduced to around the X band (ten GHz band). In a specific example where the mold size is 10 [mm]×10 [mm]×1 [mm], the entire outer periphery of the mold resin is covered with a conductor, and a dielectric constant of the mold material 3.5, the lowest order resonant frequency is 11.33 [GHz]. In the embodiment, the package is short circuited by the conductive heat spreaders 5 and 7 of the ground potential, so that the resonant frequency can be set sufficiently higher than the operating frequency and that oscillation due to coupling of the RF signals in the microwave device 100 can be prevented.

A loss between the microwave device 100 and the antenna element 210 needs to be minimized, but a certain loss is tolerated between the microwave device 100 and the transceiver 600. Accordingly, at the time of manufacturing, the antenna 500 is possible to be configured such that the RF lines are routed inside the multilayer resin substrate 110, and the plurality of RF connectors 180 is put together at a position having a small effect on the heat dissipation performance and then to be caused to pass through the heat sink 140. As a result, the heat sink 140 can be designed with emphasis on the heat dissipation performance of the heat spreaders 5 and 7. Moreover, depending on the specifications of the antenna 500, the number of the RF connectors passing through the heat sink 140 can be reduced by distributing and combining the transmission paths of the RF signal in the multilayer resin substrate 110.

The embodiment uses the CIR or switch for the transmission-reception switching circuit on the side of the antenna. The antenna elements 210 are provided on the back of the multilayer resin substrate 110 on which the CIR or switch is provided, whereby the microwave module 200 with built-in antennas can be realized, and the number of components is reduced.

In the microwave device 100-1 illustrated in FIG. 4, only the transistor is mounted on the high-cost semiconductor substrate 320 so that the chip area is minimized. Furthermore, the matching circuit is formed on the low-cost semiconductor substrate 310, whereby the cost of the microwave device 100-1 can be reduced as compared with the IC 6 of FIG. 1 in which the transistor and matching circuit are monolithically fabricated on the high-cost semiconductor substrate 320.

In the antenna 500-1 illustrated in FIG. 5, the circulators 400 are used outside the microwave devices. The circulators 400 are provided on the opposite end surface in the Y axis direction of the multilayer resin substrate 110, that is, the surface of the multilayer resin substrate 110 on the side of the antenna elements 210. This can reduce a change in the characteristic of the IC 4 due to a fluctuation in the load impedance on the antenna surface.

In the antenna 500-1 illustrated in FIG. 5, the circulators 400 are each housed in the groove 421 of the conductive chassis 420. When the shield structure similar to that of the microwave devices 100 and 100-1 is applied to the circulators 400, the shield structure of the groove 421 with respect to the conductive chassis 420 of the antenna 500-1 can be simplified. Moreover, the shield structure of the groove 421 can be omitted as with the antenna 500 when circulators having the shield structure are mounted on the same plane as the microwave device.

In the antenna 500-1 illustrated in FIG. 5, the heat sink 140 is disposed on the side opposite to the side of the antenna elements 210 with respect to the multilayer resin substrate 110. In this case, constraints in disposing the RF wiring and the RF connectors 180 are reduced as compared with a case where the heat sink 140 is disposed between the multilayer resin substrate 110 and the antenna substrate 450, and the cooling performance is improved.

The configuration illustrated in the aforementioned embodiment merely illustrates an example of the content of the preset invention, and can thus be combined with another known technique or partially omitted and/or modified without departing from the scope of the present invention.

REFERENCE SIGNS LIST 1, 110 multilayer resin substrate; 1a first plate surface; 1b second plate surface; 2 conductive film; 2a inner surface; 3 space; 4, 6 IC; 4a, 5a, 6a, 7a, 110a one end surface; 4b, 5b, 6b, 7b, 110b opposite end surface; 5, 7, 7A heat spreader; 8, 130 chip component; 11 ground via hole; 12, 13 signal via hole; 14, 19 ground pattern; 15 signal line; 16, 17, 18 pad; 20, 21 signal input/output terminal; 30, 330 fine bonding material; 41, 42, 61, 62, 311, 312 input/output terminal; 50 mold resin; 84, 85, 115, 121 signal terminal unit; 100, 100-1 microwave device; 116, 117, 118, 119 RF transmission line; 120 control IC; 140 heat sink; 150 heat dissipation sheet; 160 control board; 170 power/control connector; 180, 470 RF connector; 200, 200-1 microwave module; 210 antenna element; 310 low-cost semiconductor substrate; 310a, 320a signal pad; 313, 314 surface pattern; 315, 316 through hole; 320 high-cost semiconductor substrate; 400 circulator; 410 control IC; 420 conductive chassis; 421 groove; 450 antenna substrate; 500, 500-1 antenna; 600 transceiver; 700 distribution/combination circuit.

The invention claimed is:
1. A microwave device comprising:
a first multilayer resin substrate, the first multilayer resin substrate having a first plate surface on one side thereof and a second plate surface on an opposite side thereof;
a radio frequency circuit disposed on the second plate surface of the first multilayer resin substrate and electrically connected to the first multilayer resin substrate;
a heat spreader provided on a side opposite to the first multilayer resin substrate across the radio frequency circuit, and in contact with the radio frequency circuit;
a resin covering the periphery of the radio frequency circuit and the heat spreader; and
a conductive film covering the resin and the heat spreader and constituting a package, wherein
an inner side of the conductive film is in contact with the heat spreader,
the conductive film is electrically connected to a first ground pattern provided on the second plate surface of the first multilayer resin substrate near an outer periphery of the first multilayer resin substrate, a ground via hole formed in the first multilayer resin substrate near the outer periphery thereof and having one end electrically connected to the first ground pattern, and a second ground pattern provided on the first plate surface of the first multilayer resin substrate near the outer periphery of the first multilayer resin substrate and electrically connected to an opposite end of the ground via hole, and the heat spreader is connected to a ground potential via the package.

2. A microwave device comprising:

a first multilayer resin substrate, the first multilayer resin substrate having a first plate surface on one side thereof and a second plate surface on an opposite side thereof;

a first semiconductor substrate disposed on the second plate surface of the first multilayer resin substrate and electrically connected to the first multilayer resin substrate;

a second semiconductor substrate provided on a side opposite to the first multilayer resin substrate across the first semiconductor substrate, and electrically connected to the first semiconductor substrate;

a heat spreader provided on a side opposite to the first semiconductor substrate across the second semiconductor substrate, and in contact with the second semiconductor substrate;

a resin covering the periphery of the first semiconductor substrate, the second semiconductor substrate, and the heat spreader; and a conductive film covering the resin and the heat spreader and constituting a package, wherein an inner side of the conductive film is in contact with the heat spreader, the conductive film is electrically connected to a first ground pattern provided on the second plate surface of the first multilayer resin substrate near an outer periphery of the first multilayer resin substrate, a ground via hole formed in the first multilayer resin substrate near the outer periphery thereof and having one end electrically connected to the first ground pattern, and a second ground pattern provided on the first plate surface of the first multilayer resin substrate near the outer periphery of the first multilayer resin substrate and electrically connected to an opposite end of the ground via hole, and the heat spreader is connected to a ground potential via the package.

3. The microwave device according to claim 2, further comprising a transistor provided on the second semiconductor substrate, the second semiconductor substrate being made of gallium nitride material.

4. The microwave device according to claim 2, further comprising wherein a circuit provided on the first semiconductor substrate, the first semiconductor substrate being made of gallium arsenide material.

5. An antenna comprising:

a second multilayer resin substrate;

a microwave device according to claim 1, provided on the second multilayer resin substrate and electrically connected to the second multilayer resin substrate;

a heat dissipation sheet provided to face the second multilayer resin substrate and in contact with the conductive film of the microwave device, a heat sink provided on a side opposite to the microwave device across the heat dissipation sheet, and in contact with the heat dissipation sheet; and a control board provided on a side opposite to the heat dissipation sheet across the heat sink, and electrically connected to the microwave device, wherein the microwave device is interconnected with the control board via a first connector, and the microwave device is interconnected with a transceiver that is integrated with or provided separately from the control board via a second connector.

6. The antenna according to claim 5, wherein a modulus of elasticity of the heat dissipation sheet is lower than a modulus of elasticity of the microwave device.

7. The antenna according to claim 5, further comprising:

a conductive chassis provided on a side opposite to the microwave device across the second multilayer resin substrate; and an antenna substrate provided on a side opposite to the second multilayer resin substrate across the conductive chassis, and having a plurality of antenna elements, wherein the plurality of antenna elements is interconnected with the transceiver via the microwave device.

8. The antenna according to claim 7, wherein a groove that houses a component mounted on the second multilayer resin substrate is formed on a surface of the conductive chassis on a side of the second multilayer resin substrate, the surface of the conductive chassis on which the groove is formed is in contact with a ground plane of the second multilayer resin substrate, and the plurality of antenna elements is interconnected with the transceiver via a radio frequency connector provided in the conductive chassis and the microwave device.

9. An antenna comprising:

a second multilayer resin substrate;

a microwave device according to claim 2, provided on the second multilayer resin substrate and electrically connected to the second multilayer resin substrate;

a heat dissipation sheet provided to face the second multilayer resin substrate and in contact with the conductive film of the microwave device, a heat sink provided on a side opposite to the microwave device across the heat dissipation sheet, and in contact with the heat dissipation sheet; and a control board provided on a side opposite to the heat dissipation sheet across the heat sink, and electrically connected to the microwave device, wherein the microwave device is interconnected with the control board via a first connector, and the microwave device is interconnected with a transceiver that is integrated with or provided separately from the control board via a second connector.

* * * * *